US006382985B1

(12) United States Patent
Kajiwara

(10) Patent No.: US 6,382,985 B1
(45) Date of Patent: *May 7, 2002

(54) SOCKET FOR A DISPLAY PANEL

(75) Inventor: Yasushi Kajiwara, Kawaguchi (JP)

(73) Assignee: Enplas Corporation, Saitama (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/943,050

(22) Filed: Oct. 1, 1997

(30) Foreign Application Priority Data

Apr. 1, 1997 (JP) .............................................. 8-10841
Apr. 1, 1997 (JP) .............................................. 8-101840

(51) Int. Cl.[7] .......................... H01R 12/00; H05K 1/00
(52) U.S. Cl. ............................................ 439/67; 439/73
(58) Field of Search ........................... 439/67, 493, 70, 439/71, 72, 73, 331, 525, 526

(56) References Cited

U.S. PATENT DOCUMENTS 5,791,913 A * 8/1998 Kajiwara ..................... 439/67

FOREIGN PATENT DOCUMENTS

| | | |
|---|---|---|
| JP | 8-220175 | 8/1996 |
| JP | 8-278339 | 10/1996 |

* cited by examiner

*Primary Examiner*—Khiem Nguyen
*Assistant Examiner*—Javaid Nasri
(74) *Attorney, Agent, or Firm*—Fish & Richardson P.C.

(57) ABSTRACT

A display panel socket has a substantially rectangular socket body, panel positioning means for positioning the substrate of the display panel with respect to the socket body, film attachment boards attached to the socket body in parallel to the directions of arrangement of electrode terminals of the display panel via position adjusting means so that the positions can be adjusted, and flexible wiring boards which are attached to the film attachment boards and have contactors to be brought in contact with the electrode terminals of the display panel. Each of the position adjusting means has a biasing spring for spring biasing a film attachment board in one direction among the longitudinal directions of the same and an adjustment member for adjusting the position of an end portion of the film attachment board against the spring force. Both of the biasing spring and the adjustment member are arranged on the socket body so that they act upon the same end portion of the film attachment board.

6 Claims, 7 Drawing Sheets

SOCKET FOR A DISPLAY PANEL

BACKGROUND OF THE INVENTION

1. Field of the Invention

The present invention relates to a display panel socket, which can be preferably used for an inspection of the display quality of a liquid crystal display panel, a plasma display panel, etc.

2. Description of the Related Art

In general, in the manufacturing process of a liquid crystal display panel, the display panel is inspected for display defects, display quality, etc. before connection of IC tabs for drive use and other peripheral circuits. In this case, in order to turn on the display panel, it is necessary to bring contact members into contact with the electrode terminals arranged on a substrate of the display panel. Therefore, conventionally, pin shaped or wire shaped probes, flexible wiring boards comprised of plastic film substrates on which contactor patterns are formed, etc., have been used as the members for contact with the electrode terminals. Along with the rise of density of electrode terminals and the increasing fineness of the pitch, the trend is toward use of flexible wiring boards from the viewpoint of the reliability of contact with the electrode terminals, facility of handling, manufacturing costs, etc.

Further, Japanese Unexamined Patent Publication (Kokai) No. 08-220175 and Japanese Unexamined Patent Publication (Kokai) No. 08-278339 of the present assignee disclose a display panel socket capable of performing the inspection of the display quality of the display panel and an aging test for inspecting the durability of the display panel under a high temperature. This display panel socket has a substantially rectangular socket body provided with a panel positioning means for holding the substrate of the display panel. The socket body is provided with film attachment boards extending along directions of arrangement of the electrode terminals on the substrate of the display panel via position adjusting means so that the positions thereof can be adjusted in the longitudinal direction. Onto the film attachment boards, flexible wiring boards having contactors for contact with the electrode terminals of the display panel are attached. Accordingly, by adjusting the positions of end portions of the film attachment boards by the position adjusting means, the positioning between the electrode terminals on the substrate of the display panel and the contactors on the flexible wiring boards attached to the film attachment boards can be carried out on the socket body. Then, by pressing the substrate of the display panel from the rear of the electrode terminals by a panel pressing member provided on the socket body, the display panel can be fixed to the socket body and, at the same time, the electrode terminals and the contactors can be held in the contact state by a required contact pressure.

However, in the above-mentioned conventional display panel socket, each of the position adjusting means for adjusting the positions of the end portions of the film attachment boards has a biasing spring for pressing one end portion of the film attachment board in the longitudinal direction and an adjustment member abutting against the other end portion of the film attachment board against the pressing force. Therefore a compressive load will act upon the two ends of the film attachment board in the longitudinal direction and warping will occur in the film attachment board due to the compressive load. Thus, it is considered that an adverse influence will be exerted upon the precision of positioning the contactors of the flexible wiring board attached to the film attachment board and the electrode terminals on the display panel, and upon the durability. Further, in a liquid crystal display panel, generally electrode terminals are arranged along two sides or along three sides of the substrate. In the conventional display panel socket mentioned above, it is necessary to arrange the biasing spring and the adjustment member of a position adjusting means at the corner portion of the socket body at one end of the film attachment board and the corner portion of the socket body at the other end of the film attachment board, so there arises a problem that if it is intended to arrange a biasing spring or an adjustment member of a position adjusting means of another film attachment board at the corner portions of the socket body, the size of the socket body is enlarged.

SUMMARY OF THE INVENTION

Accordingly, an object of the present invention is to provide a display panel socket which can be easily applied to even a display panel in which electrode terminals are arranged at two sides or three sides of the substrate.

To attain the above object, according to the present invention, there is provided a display panel socket provided with a substantially rectangular socket body, a panel positioning means for positioning the substrate of the display panel with respect to the socket body, film attachment boards attached to the socket body in parallel to the directions of arrangement of electrode terminals of the display panel via position adjusting means so that the positions can be adjusted, and flexible wiring boards which are attached to the film attachment boards and have contactors to be brought in contact with the electrode terminals of the display panel, the display panel socket characterized in that each of the position adjusting means has a biasing spring for spring biasing a film attachment board in one direction among the longitudinal directions of the same and an adjustment member for adjusting the position of an end portion of the film attachment board against the spring force and in that both of the biasing spring and the adjustment member are arranged on the socket body so that they act upon the same end portion of the film attachment board.

In the display panel socket having the above configuration, by adjusting the position of the film attachment board with respect to the socket body by the position adjusting means, the positioning between the electrode terminals of the display panel held by the panel positioning means of the socket body and the contactors of the flexible wiring board attached onto the film attachment board can be carried out. In addition, both of the biasing spring and the adjustment member constituting the position adjusting means are arranged on the socket body so as to act upon the same end portion of the film attachment board, therefore a compressive force due to the biasing spring and the adjustment member can be prevented from being applied between the two ends of the film attachment board. Accordingly, occurrence of warping of the film attachment board due to the compressive force can be reliably prevented, so a reduction of the positioning precision between the electrode terminals and the contactors of the flexible wiring board can be prevented over the entire arrangement of the electrode terminals of the display panel. Further, since both of the biasing spring and the adjustment member constituting the position adjusting means are arranged on the socket body so as to act upon the same end portion of the film attachment board, on the socket body on the other end of the film attachment board, space for arrangement of a biasing spring and adjustment member constituting the position adjusting means of another film attachment board can be easily secured on the socket body at the other end portion of the film attachment board. Accordingly, a display panel socket which can be applied without causing interference between the position adjusting means and the enlargement of size of the socket body can be provided with respect to various types of display panels in which electrode terminals are arranged at two sides or three sides of the substrate.

Preferably, on the socket body, elongated grooves, for holding the film attachment boards so that they can slidingly displace in their longitudinal direction, are formed along at least two adjoining sides of the socket body. The elongated grooves formed at the two sides extend crossing each other. The adjustment members of the position adjusting means have end pieces which are slidably accommodated in the elongated grooves and attached to the end portions of the film attachment boards. Abutment pieces which are accommodated in the end portions of the elongated grooves so as to abut against inclined end portions are formed at the end pieces, and adjustment screws are provided for displacing the abutment pieces in a depth direction of the elongated grooves. The end pieces are formed so that two end pieces can freely slidingly displace while crossing each other at the crossing portion of the elongated grooves when attached to the film attachment boards. Spring holding portions for holding the biasing springs of the position adjusting means are provided near the crossing portion of the elongated grooves of the socket body corresponding to the elongated grooves.

According to the above configuration, the end portions and abutment pieces constituting the adjustment members of the position adjusting means can be accommodated in the end portions of the elongated grooves for accommodating the film attachment boards, therefore a display panel socket which is compact and can arrange the film attachment boards at appropriate positions so that the positions can be adjusted in accordance with the form of arrangement of the electrode terminals of the display panel can be provided.

Further preferably, the elongated grooves are formed along three sides of the socket body; and the crossing portions of the elongated grooves are formed at two positions.

According to the above configuration, even in a case where there are electrode terminals at one side of the display panel and either the left or right side of the same (two sides in total) or even in a case where there are electrode terminals at one side of the display panel and both of the left and right sides of the same (three sides in total), a display panel socket capable of arranging the film attachment boards at appropriate positions so that the positions can be adjusted can be provided.

Further preferably, the panel positioning means has panel positioning pieces which are provided near two of the crossing portions of the elongated grooves and engaged with corner portions of the substrate of the display panel and a substrate pressing means for pressing the other corner portions of the display panel toward the panel positioning piece; and the substrate pressing means can be respectively detachably attached to the two of the crossing portions of the elongated grooves and two corner portions of the socket body facing each other in the diagonal direction.

According to the above configuration, by pressing the corner portions of the display panel toward the panel positioning piece by the substrate pressing means, the display panel can be reliably positioned and held on the socket body and, at the same time, the display panel can be easily attached and detached to and from respect to the socket body. In addition, the substrate pressing means can be detachably attached to two corner portions of the socket body facing the two of the crossing portions of the elongated groove in the diagonal direction, therefore the display panel can be biased in a direction of suitable panel positioning pieces corresponding to display panels having different electrode terminal arrangements.

Preferably, the film attachment board is a printed wiring board having a wiring pattern which is connected to the contactors of the flexible wiring board.

According to the above configuration, since the film attachment board is a printed wiring board having the wiring pattern which is connected to the contactors of the flexible wiring board, it becomes unnecessary to separately provide a printed wiring board for sending signals to the flexible wiring board.

Further preferably, the biasing spring comprises a linear or plate shape spring piece engaged with a projection projected from the top surface of the end piece; and the spring holding portion has projections engaged with the two ends of the spring piece.

According to the above configuration, the linear or plate shape spring piece serving as the biasing spring can be easily arranged at a corner portion of socket body without interference with the adjustment member, therefore a display panel socket which is compact and enables provision of the film attachment boards at appropriate portions adjustable in position corresponding to the arrangement of the electrode terminals of the display panel can be provided.

DESCRIPTION OF THE PREFERRED EMBODIMENTS

Figure 1:
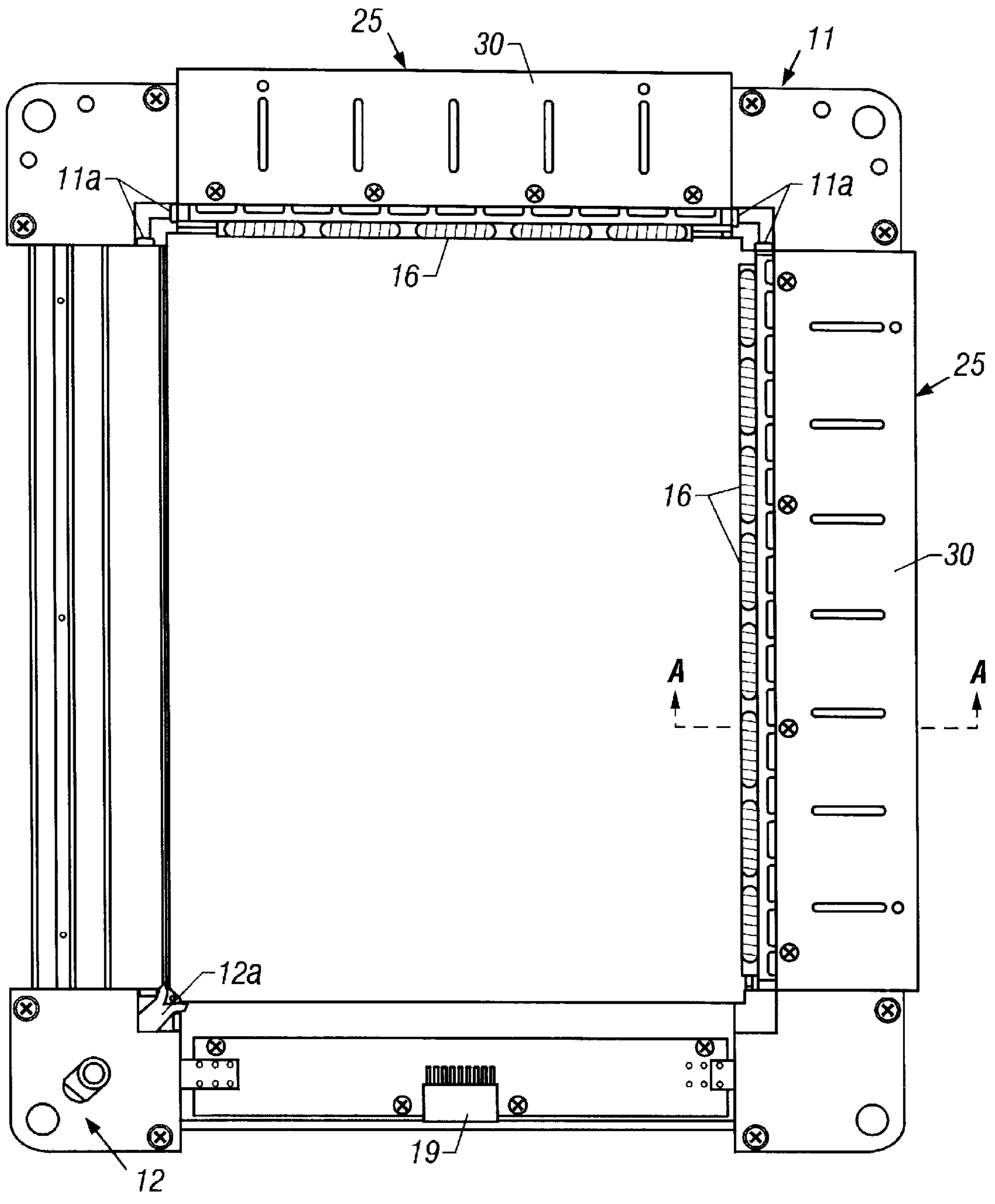
FIG. 1 is a plan view of an embodiment where the present invention is applied to a display panel socket for inspecting a liquid crystal display panel shown in FIG. 8A.

Below, an explanation will be given of preferred embodiments of the present invention by referring to the drawings.

Figure 2:
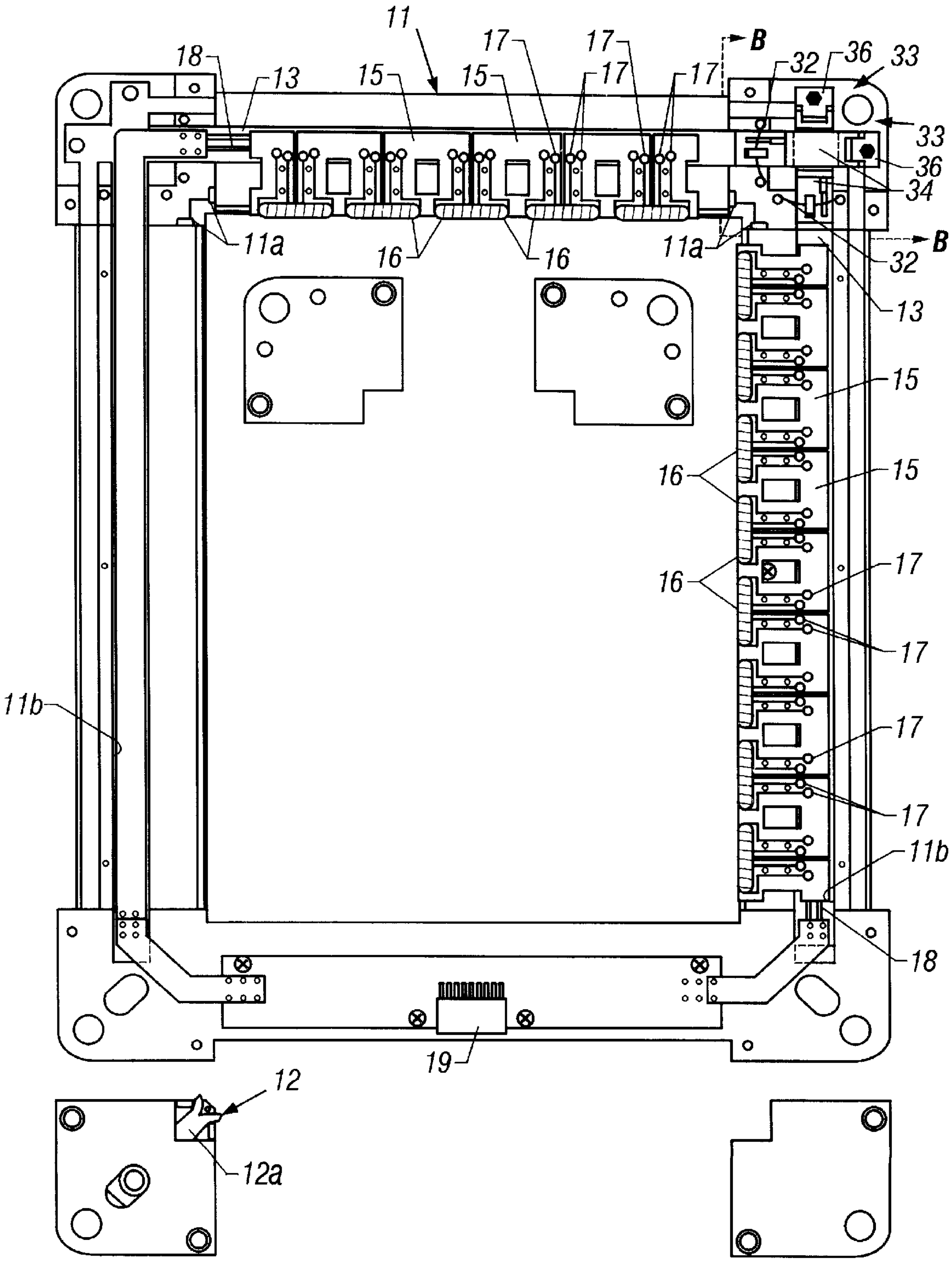
FIG. 2 is a plan view of an internal structure of the display panel socket shown in FIG. 1.
Figure 3A:
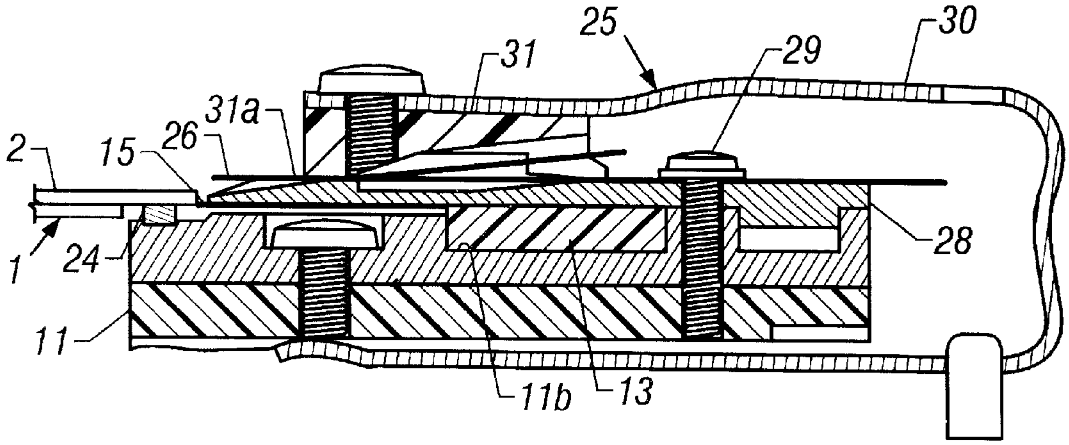
FIG. 3A and FIG. 3B are sectional views along a line A—A in FIG. 1 showing an operation of the socket shown in FIG. 1.
Figure 3B:
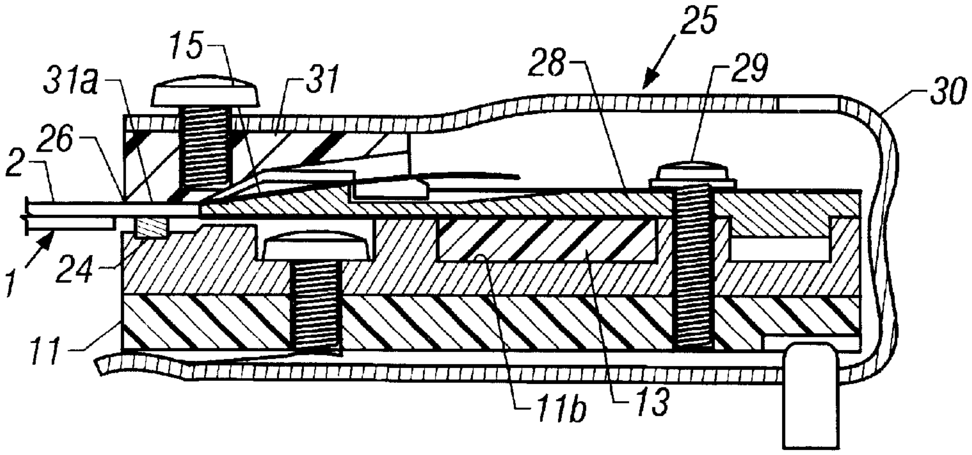
Figure 4:
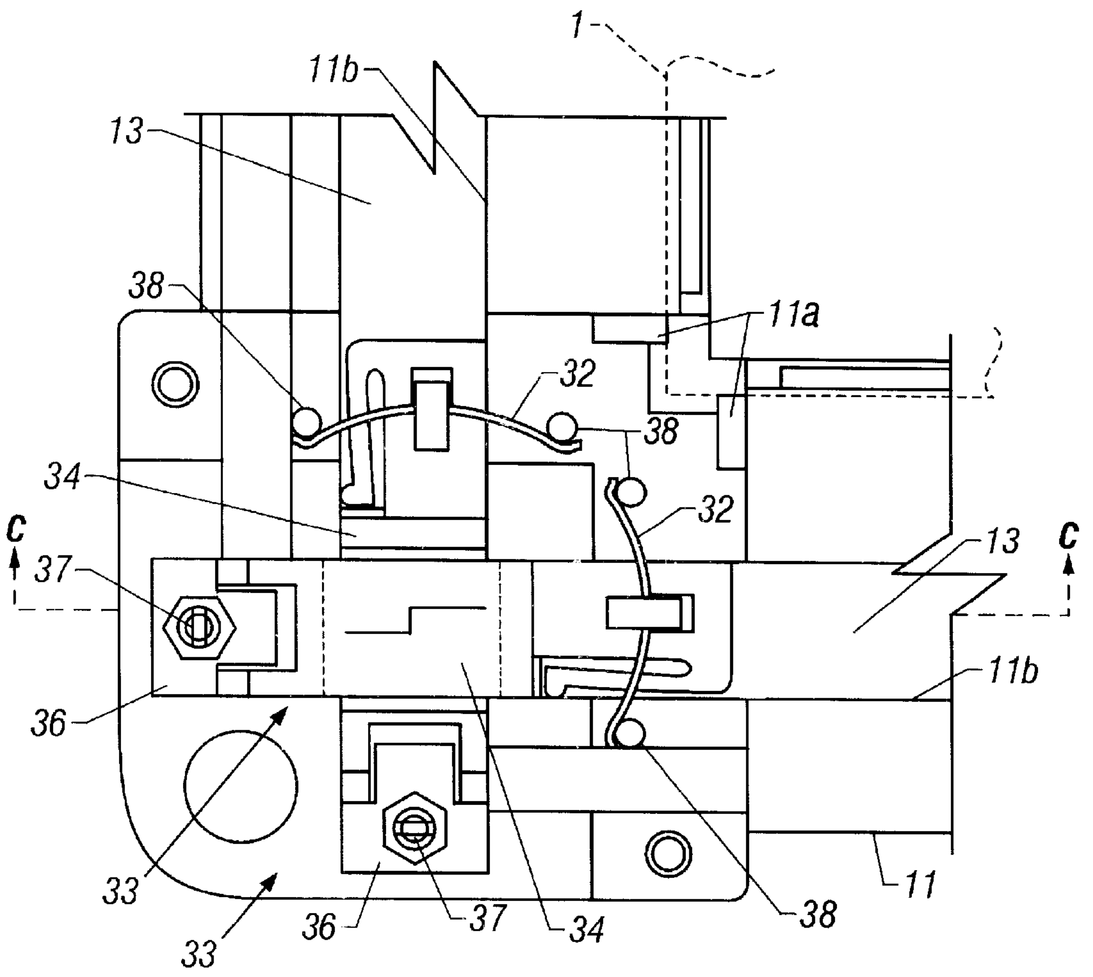
FIG. 4 is an enlarged plan view of a corner portion shown by a line B—B in FIG. 2 of the socket shown in FIG. 1.
Figure 5:
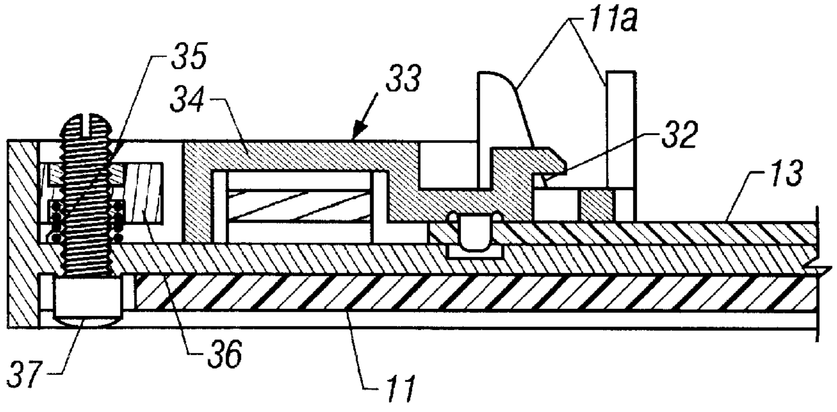
FIG. 5 is a sectional view taken along a line C—C in FIG. 4 of the socket shown in FIG. 1.

FIG. 1 to FIG. 5 show a first embodiment of a case where the present invention is applied to a display panel socket, where FIG. 1 is a plan view of the display panel socket; FIG. 2 is a disassembled plan view of principal parts showing an internal structure of the socket shown in FIG. 1; FIG. 3A and FIG. 3B are sectional views taken along the line A—A in FIG. 1 showing a state of usage when the liquid crystal display panel is mounted in the socket shown in FIG. 1; FIG. 4 is an enlarged view of a part shown by the line B—B of the socket shown in FIG. 2; and FIG. 5 is a sectional view taken along the line C—C of FIG. 4. Further, 5 FIG. 8A to FIG. 8C are schematic front views of examples of the configuration of liquid crystal display panels having different arrangements of electrode terminals.

Figure 8A:
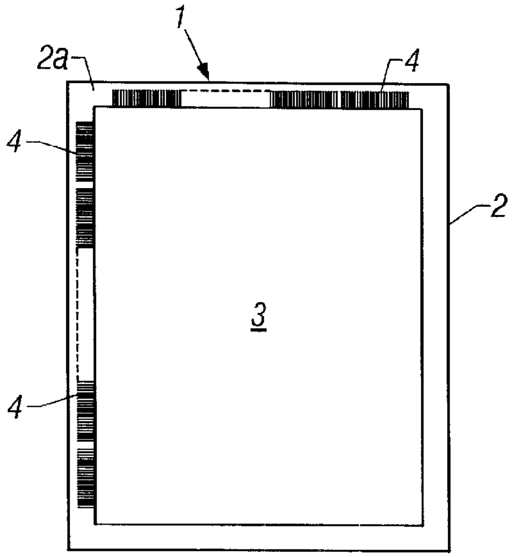
FIG. 8A, FIG. 8B, and FIG. 8C are schematic front views of the liquid crystal display panel having different electrode arrangements.
Figure 8B:
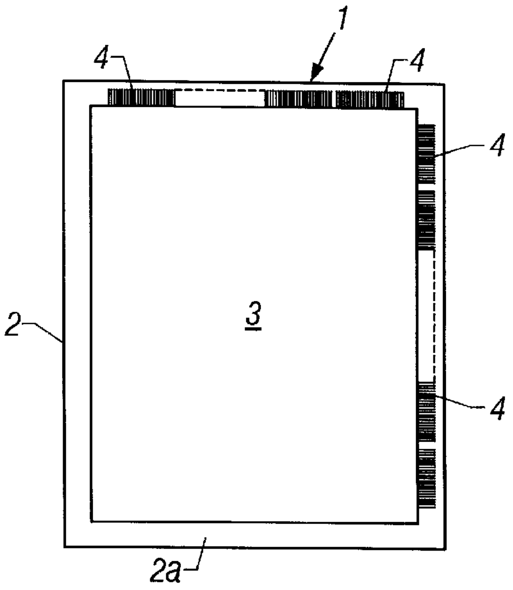
Figure 8C:
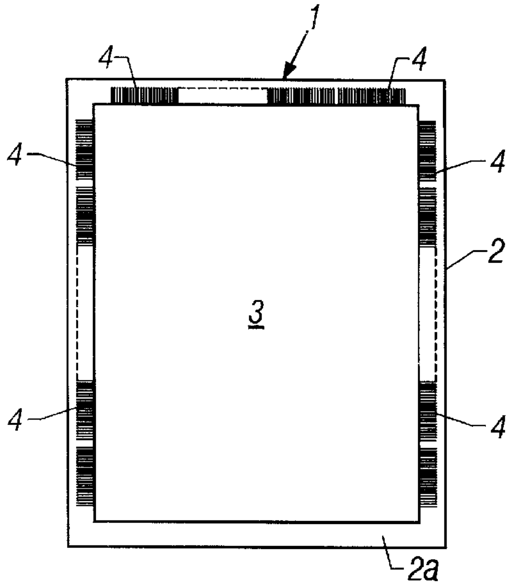

First, referring to FIG. 8A to FIG. 8C, in the liquid crystal display panel 1 of an active matrix system inspected by the display panel socket of the present invention, a rectangular liquid crystal display portion 3 is formed projecting out from one surface 2*a* of a rectangular insulating substrate 2 made of glass. A plurality of electrode terminals are divided into blocks for every liquid crystal driving module and arranged in parallel to each thereof on one surface of the insulating substrate 2 along the sides of the liquid crystal display portion 3. In the liquid crystal display panel 1 of FIG. 8A and FIG. 8B, electrode terminals 4 are arranged at two sides (long side and short side) of the insulating substrate 2, that is, the electrode terminals 4 are arranged at the long side at the left in the front view of the liquid crystal display panel 1 of FIG. 8A, while the electrode terminals 4 are arranged at the long side at the right in the front view of the liquid crystal display panel 1 of FIG. 8B. On the other hand, in the liquid crystal display panell of FIG. 8C, the electrode terminals are arranged at three sides (two long sides and one short side) of the insulating substrate 2.

Referring to FIG. 1 to FIG. 3, the display panel socket according to an embodiment of the present invention has a socket body 11 substantially rectangular in the plan view which can be applied also to any of the liquid crystal display panels 1 shown in FIG. 8A to FIG. 8C, but the related parts are assembled so as to be suited to the liquid crystal display panel 1 shown in FIG. 8A. As shown in FIG. 1, panel positioning pieces 11*a* engaged with the corner portions of the insulating substrate 2 of the liquid crystal display panel 1 are provided at two corner portions of the socket body 11 (top left and right corner portions in FIG. 1) and a substrate pressing means 12 is provided for pressing the insulating substrate 2 of the liquid crystal display panel 1 toward the panel positioning piece 11*a* at the top right in FIG. 1. This substrate pressing means 12 is detachably attached to the bottom left corner portion of the socket body 11 in FIG. 1 and has a movable engagement piece 12*a* engaged with the corner portion of the insulating substrate 2 and a spring (not illustrated) for biasing this movable engagement piece 12*a* in the direction of the panel positioning pieces 11*a*.

Elongated grooves 11*b* extending in parallel to the sides of the insulating substrate 2 are formed in one short side portion and two long side portions of the top surface of the socket body 11. Here, corresponding to the two sides where the electrode terminals 4 are formed among the four sides of the insulating substrate 2 of the liquid crystal display panel 1 shown in FIG. 8A, film attachment boards 13 made of a material preferably having almost the same coefficient of linear expansion as that of the insulating substrate 2, for example, a glass epoxy resin, are accommodated in the elongated grooves 11*b* located at the short side portion of the socket body 11 and the long side portion on the right in FIG. 1 so that they can slidingly displace in their longitudinal directions.

As shown in FIG. 1, FIG. 2, and FIG. 3A and FIG. 3B, the rear end portions of a plurality of flexible films 15 provided with a plurality of contactors 16 (refer to FIG. 2) are attached to the front end portions on the top surfaces of the film attachment boards 13. The flexible films 15 can be formed by various plastics, but when the inspection socket is used for the inspection of the aging of the liquid crystal display panel 1, preferably the flexible films 15 are formed by a resin, for example, a polyimide, able to withstand an ambient temperature of 80 to 100.

As shown in FIG. 3A, the socket body 1 has attached to it an elastic support member 24 made of a molded article of, for example, a silicone rubber abutting against the back surfaces (lower surfaces) of the flexible films 15 behind the contactors 16. This elastic support member 24 extends along the direction of arrangement of the electrodes of the liquid crystal display panel 1. The liquid crystal display panel 1 is placed on the flexible film 15.

Further, the display panel inspection apparatus is provided with a panel pressing member 25 provided on the socket body 11 so that it can slidingly operate in a direction indicated by the arrow in FIG. 1 so as to press the insulating substrate 2 of the liquid crystal display panel 1 against the flexible films 15 when moving to the top surface of the insulating substrate 2 of the liquid crystal display panel 1 placed on the flexible films 15 and with a flexible shutter 26 with a front end (left end in FIG. 3A)which is interposed between the panel pressing member 25 and the insulating substrate 2 of the liquid crystal display panel 1 when the panel pressing member 25 presses against the insulating substrate 2 of the liquid crystal display panel 1. Further, a spring (not illustrated) for biasing the rear end of the shutter 26 forward is attached to the socket body 11. The front end of the shutter 26 can move from the retracted position (refer to FIG. 3A) for opening the area for mounting the liquid crystal display panel to the covered position (not illustrated) for covering the top surface of the side edge portions of the insulating substrate 2 of the liquid crystal display panel 1 by the biasing force of this spring. A support plate 28 covering the top of the flexible films 15 and with a front end which is extended along the side edge portions of the insulating substrate 2 of the liquid crystal display panel is attached to the socket body 11. The shutter 26 is slidably supported on this support plate 28. This panel pressing member 25 of this embodiment comprises a damper 30 made of metal having a lateral U-shaped cross-section having a spring property mounted on the socket body 11 so as to vertically sandwich the socket body 11 and the insulating substrate 2 of the liquid crystal display panel 1 and a sliding piece 31 made of a plastic which slidingly contacts the top surface of the shutter 26, while being affixed to the lower surface of the upper piece by for example a screw, over almost the entire length of the upper piece of the damper 30. As the plastic material used for the sliding piece 31, preferably a material having an abundant lubricity, for example, a polytetrafluoroethylene, is preferred. Although the illustration is omitted, an engagement portion which can be engaged with the sliding piece 31 is provided on the shutter 26. The sliding piece 31 is engaged with the engagement portion of the shutter 26 when moving back from the pressing position for pressing the insulating substrate 2 of the liquid crystal display panel 1 (refer to FIG. 3B) to the opening position for opening the area for mounting the liquid crystal display panel. Then, when the panel pressing member 25 further moves back from the opening position to the retracted position shown in FIG. 3A, the shutter 26 is moved from the covered position to the retracted position against the biasing force of the spring by the panel pressing member 25.

As shown in FIG. 2, the contactors 16 on the front end portions of the flexible films 15 are connected to the signal wiring pattern 18 formed on the film attachment boards 13 via the signal input portions 17 provided on the rear ends of the flexible films 15. The signal wiring pattern is connected to the connectors 19 provided on the socket body 11. Namely, the film attachment boards 13 comprise printed wiring boards for supplying signals to the flexible wiring boards 15.

The film attachment boards 13 are attached with respect to the socket body 11 so that they can be adjusted in position in parallel to the direction of arrangement of the electrode terminals of the liquid crystal display panel 1 via the position adjusting means, is which are a characterizing feature of the present invention. Referring to FIG. 2 and FIG. 4, each of the position adjusting means has a biasing spring 32 for biasing a film attachment board 13 in a longitudinal direction and an adjustment member 33 for adjusting the position of the end portion of the film attachment board 13 against this spring force. Both of the biasing spring 32 and the adjustment member 33 are arranged on the socket body 11 so that they act upon the same end portion of the film attachment board 13.

Explaining this in further detail, as mentioned above, three elongated grooves 11*b* for holding the film attachment boards 13 so that they can slidingly displace in the longitudinal directions thereof are formed in the socket body 11 along three sides of the socket body 11. The elongated grooves 11*b* formed at the two facing sides extend crossing the elongated groove 11*b* formed at the other one side. Further, each of the adjustment members 33 of the position adjusting means has an end piece 34 which is slidably accommodated in an elongated groove 11*b* and attached to the end portion of a film attachment board 13, an abutment piece 36 which is accommodated in the end portion of the elongated groove 11*b* so as to abut against the inclined end portion 35 formed at the end piece 34, and an adjustment screw 37 for displacing this abutment piece 36 in the depth direction of the elongated groove 11*b*. The end piece 34 is formed so that two end pieces 34 can freely slidingly displace while crossing each other at the crossing portion of two elongated grooves 11*b* and 11*b* when attached to the film attachment board 13.

A screw holding portion 38 for holding the biasing spring 32 of the position adjusting means is provided near the crossing portion of the elongated grooves 11*b* in the socket body 11 corresponding to the elongated grooves 11*b*.

In the display panel socket having the above configuration, by adjusting the position of the film attachment boards 13 with respect to the socket body 11 by the position adjusting means, the positioning between the electrode terminals of the display panel held by the panel positioning means 11*a* of the socket body 11 and the contactors 16 of the flexible wiring boards 15 attached onto the film attachment boards 13 can be carried out.

In addition, both of the biasing spring 32 and the adjustment member 33 constituting the position adjusting means are arranged on the socket body 11 so that they act upon the same end portion of the film attachment board 13, therefore the compressive force by the biasing spring 32 and the adjustment member 33 can be prevented from being applied between the two end portions of the film attachment board 13. Accordingly, the occurrence of warping of the film attachment board 13 due to the compressive force can be reliably prevented, so the lowering of the positioning precision between the electrode terminals 4 and the contactors 16 of the flexible wiring boards 15 can be prevented over the entire arrangement of electrode terminals of the display panel 1. Further, since both of the biasing spring 32 and the adjustment member 33 constituting the position adjusting means are arranged on the socket body 11 so that they act upon the same end portion of the film attachment board 13, space for arrangement of a biasing spring 32 and adjustment member 33 constituting another position adjusting means of a film attachment board 13 can be easily secured on the socket body 11 on the other end of the film attachment board 13. Accordingly, the display panel socket having the above configuration can be applied also to various display panels in which electrode terminals 4 are arranged at two sides or three sides of the substrate 2 without causing interference between the position adjusting means and the enlargement of size of the socket body 11.

Further, according to the above configuration, the end piece 34 and abutment piece 35 constituting the adjustment member 33 of the position adjusting means can be accommodated in the end portion of an elongated groove 11*b* for accommodating the film attachment board 13, therefore the apparatus becomes compact and, at the same time, the film attachment board 13 can be arranged at an appropriate portion so that the position can be adjusted in accordance with the arrangement of the electrode terminals of the display panel 1.

Further, according to the above configuration, by pressing a corner portion of the display panel toward the panel positioning piece by the substrate pressing means 12, the display panel can be reliably positioned and held on the socket body and, at the same time, the display panel can be easily attached to and detached from the socket body. In addition, the substrate pressing means 12 can be detachably attached to two corner portions of the socket body 11 facing the elongated groove crossing portions at two positions in the diagonal direction, therefore the liquid crystal display panel 1 can be biased in the adequate direction of the panel positioning piece 11 a corresponding to display panels 1 having different arrangements of electrode terminals 4.

Further, according to the above configuration, the film attachment boards 13 are printed wiring substrates having wiring patterns 18 to be connected to the contactors 16 of the flexible wiring boards 15, therefore it becomes unnecessary to separately provide printed wiring boards for sending signals to the flexible wiring boards.

Further, according to the above configuration, the linear or plate shape spring pieces serving as the biasing springs 32 can be easily arranged at corner portions of the socket body 11 without interference with the adjustment members 33, therefore the socket can be made compact and, at the same time, the film attachment boards 13 can be arranged at appropriate portions so that the positions can be adjusted in accordance with the arrangement of electrode terminals of the display panel 1.

Figure 6:
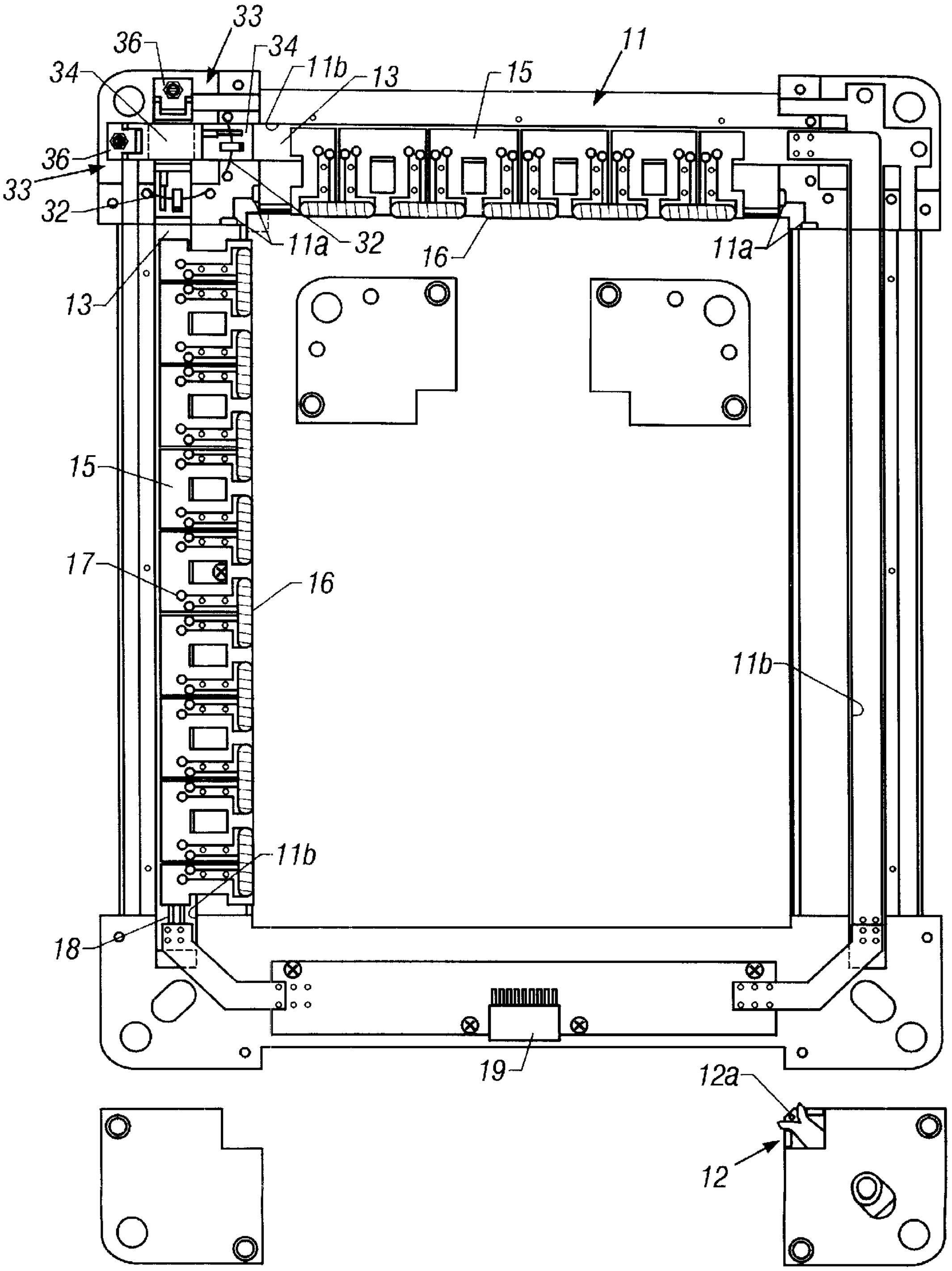
FIG. 6 is a plan view similar to FIG. 2 showing a state where the display panel socket shown in FIG. 1 is reassembled for inspection of the liquid crystal display panel shown in FIG. 8B.
Figure 7:
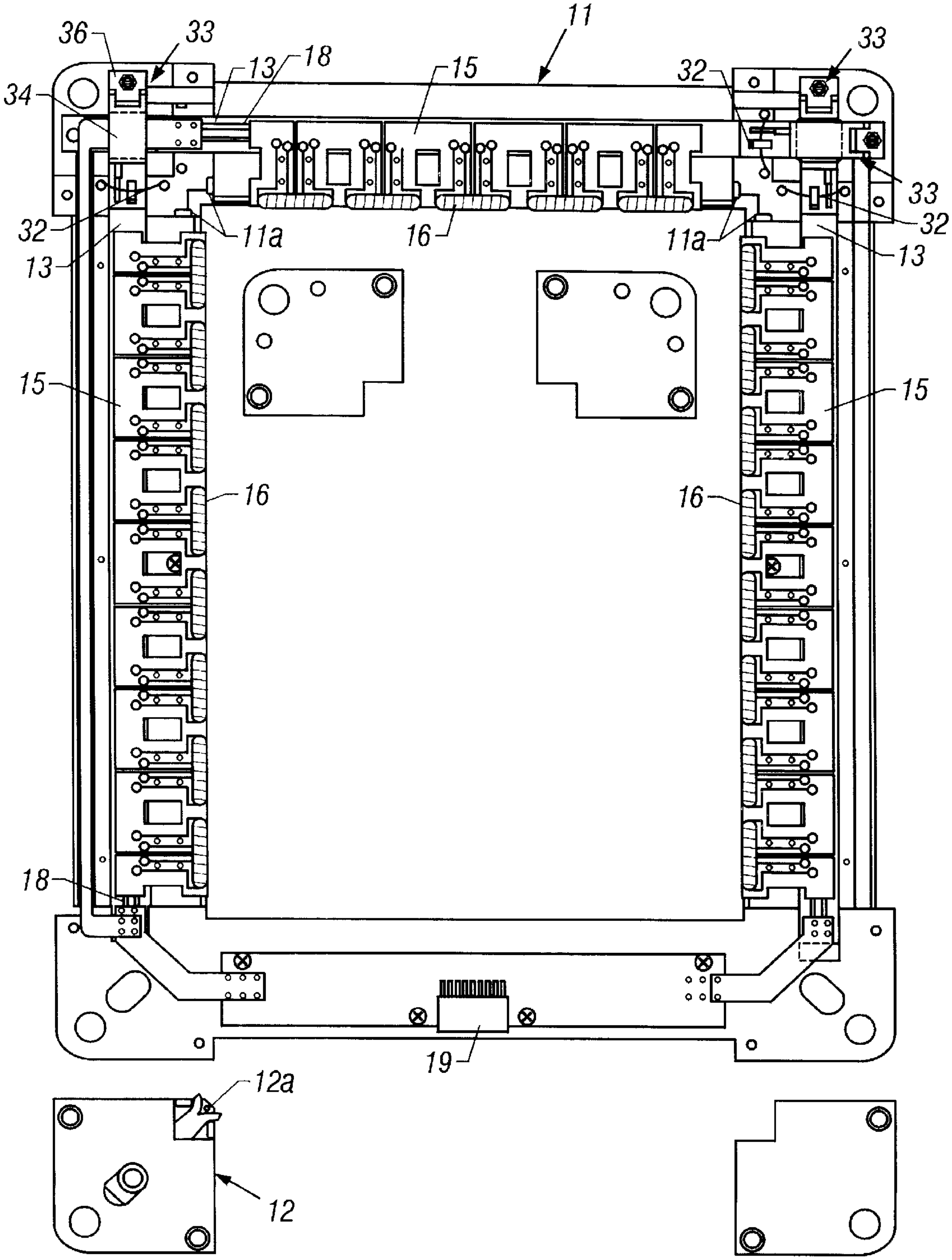
FIG. 7 is a plan view similar to FIG. 2 showing a state where the display panel socket shown in FIG. 1 is reassembled for inspection of the liquid crystal display panel shown in FIG. 8C.

FIG. 6 shows a display panel socket in which related parts are reassembled with respect to the socket body 11 of the above embodiment so as to be suited to the liquid crystal display panel 1 of FIG. 8B; while FIG. 7 shows a display panel socket in which related parts are reassembled with respect to the socket body 1 of the above embodiment so as to be fitted to the liquid crystal display panel 1 of FIG. 8B. In these figures, the same reference symbols are given to the same constituent elements as those of the above embodiment.

In the display panel socket shown in FIG. 6, the film attachment board 13 for the long side of the socket body 11 is moved into the elongated groove 11*b* of the long side of the socket body 11 at the left in the figure in accordance with the liquid crystal display panel 1 of FIG. 8B. The biasing springs 32 and the adjustment members 33 forming two sets of position adjusting means are moved to the crossing portion of the elongated grooves at the top left corner portion in the figure accompanied with this. Further, the substrate pressing means 12 for pressing the corner portion of the display panel 1 toward the panel positioning piece 11*a* located at the top left corner portion of the socket body 11 in the figure is detachably attached to the bottom right corner portion of the socket body 11.

Further, in the display panel socket shown in FIG. 7, the film attachment board 13 for the left long side in the figure is additionally provided in the elongated groove 11*b* of the socket body 11 at the left long side in the figure in accordance with the liquid crystal display panel of FIG. 8C. The biasing spring 32 and adjustment member 33 forming the position adjusting means for the film attachment board 13 for left long side are provided at the crossing portion of the elongated grooves located at the top left corner portion of the socket body 11 in the figure. Further, the substrate pressing means 12 for pressing the corner portion of the display panel 1 toward the panel positioning piece 11*a* located at the top left corner portion of the socket body 11 in the figure is detachably attached to the right bottom corner portion of the socket body 11.

As apparent from the above explanation, according to the present invention, a display panel socket which can be easily applied to a display panel on which electrode terminals are arranged at two sides or three sides of the substrate can be provided.

What is claimed is:

1. A socket for inspection of a display panel having a substrate and electrode terminals arranged on the substrate along sides of the substrate, the socket comprising:

a substantially rectangular socket body;

a panel positioning means for positioning the substrate of the display panel with respect to the socket body;

a plurality of film attachment boards attached to the socket body parallel to directions of arrangement of the electrode terminals of the display panel, each of the film attachment boards having an end portion;

position adjusting means for adjusting positions of the film attachment boards; and a plurality of flexible wiring boards attached to the film attachment boards and having contactors to be brought in contact with the electrode terminals of the display panel, wherein the position adjusting means have biasing springs for spring biasing the film attachment boards and adjustment members for adjusting the positions of the film attachment boards against the biasing springs, each of the film attachment boards being connected to one of the adjustment members and one of the biasing springs at the end portion thereof.

2. The socket according to claim 1, further comprising a plurality of elongated grooves for holding the film attachment boards so that each film attachment board can slidingly displace in a longitudinal direction, said elongated grooves being formed on the socket body along at least two adjoining sides of the socket body and crossing each other at a crossing portion, wherein the adjustment members of the position adjusting means have end pieces which are slidably accommodated in the elongated grooves and attached to the end portions of the film attachment boards at the end portion of each of the film attachment boards, abutment pieces which are accommodated in the elongated grooves at an end portion of each of the elongated grooves so as to abut against an inclined end portion formed at each of the end pieces; and a plurality of adjustment screws for displacing the abutment pieces in a depth direction of the elongated grooves, the end pieces being formed so that two end pieces can slide freely while crossing each other at the crossing portion of the elongated grooves when attached to the film attachment boards; and a plurality of spring holding portions for holding the biasing springs of the position adjusting means provided on the socket body near the crossing portion of the elongated grooves corresponding to the elongated grooves.

3. The socket according to claim 2, wherein the elongated grooves are formed along three sides of the socket body and wherein the elongated grooves have two corner crossing portions at two corner portions of the socket body.

4. The socket according to claim 3, wherein the panel positioning means has two panel positioning pieces which are provided near the two crossing portions of the elongated grooves and engaged with corner portions of the substrate of the display panel and a substrate pressing means for pressing another corner portion of the substrate of the display panel toward one of the two panel positioning pieces and wherein the substrate pressing means can be detachably attached to one of the other corner portions of the socket body.

5. The socket according to claim 1, wherein each of the film attachment boards is a printed wiring board having a wiring pattern which is connected to the contactors of the flexible wiring boards.

6. The socket according to claim 2, wherein each of the biasing springs comprises a linear or plate shape spring piece engaged with a projection projected from a top surface of one of the end pieces; and wherein each of the spring holding portions has projections engaged with the two ends of one of the spring pieces.

* * * * *